United States Patent
Chatroux et al.

(10) Patent No.: US 8,883,361 B2
(45) Date of Patent: Nov. 11, 2014

(54) VOLTAGE CONTROL DEVICE FOR A FUEL CELL

(75) Inventors: Daniel Chatroux, Teche (FR); Julien Dauchy, Chatte (FR)

(73) Assignee: Commissariat a l'energie atomique et aux energies alternatives, Paris (FR)

(*) Notice: Subject to any disclaimer, the term of this patent is extended or adjusted under 35 U.S.C. 154(b) by 420 days.

(21) Appl. No.: 13/395,207

(22) PCT Filed: Sep. 13, 2010

(86) PCT No.: PCT/EP2010/063397
§ 371 (c)(1), (2), (4) Date: Apr. 6, 2012

(87) PCT Pub. No.: WO2011/029933
PCT Pub. Date: Mar. 17, 2011

(65) Prior Publication Data
US 2012/0182005 A1 Jul. 19, 2012

(30) Foreign Application Priority Data
Sep. 14, 2009 (FR) ...................................... 09 04381

(51) Int. Cl.
*H01M 8/00* (2006.01)
*H01M 8/04* (2006.01)
*G01R 31/36* (2006.01)

(52) U.S. Cl.
CPC ........ *H01M 8/04671* (2013.01); *G01R 31/3658* (2013.01); *H01M 8/04552* (2013.01); *Y02E 60/50* (2013.01)
USPC .......................................... 429/431; 320/101

(58) Field of Classification Search
USPC .......... 429/50, 61, 91, 92, 431, 471; 320/101, 320/134, 137, 132, 118
See application file for complete search history.

(56) References Cited

U.S. PATENT DOCUMENTS

| 3,666,562 A | 5/1972 | Sprengel |
| 5,517,401 A * | 5/1996 | Kinoshita et al. ............... 363/98 |

(Continued)

FOREIGN PATENT DOCUMENTS

| DE | 25 59 364 | 7/1977 |
| EP | 0 777 286 | 6/1997 |

(Continued)

OTHER PUBLICATIONS

*International Search Report*, PCT/EP2010/063397, issued Jun. 12, 2010 (5 pages).

*Primary Examiner* — Rajnikant Patel
(74) *Attorney, Agent, or Firm* — Occhiuti & Rohlicek LLP

(57) ABSTRACT

The invention relates to a device for controlling the voltage of a cell of a fuel cell, characterized in that said control device comprises a first transistor (Q1) associated with the cell, which is connected to the cell via the base thereof and to a current generator, and a control voltage source (VRi) inserted between the cell and the first associated transistor (Q1), the control voltage source supplying a control voltage equal to the voltage differential between the first and second threshold voltages, such that: when the cell has a voltage (V1) higher than a first threshold voltage, the first transistor (Q1) has a voltage (Vbe1), at the terminals of the base-emitter junction thereof, which is higher than the second threshold voltage, and which conducts the current, and, when the cell has a voltage (V1) which is lower than the first threshold voltage, the first transistor (Q1) has a voltage (Vbe1), at the terminals of the base-emitter junction thereof, which is lower than the second threshold voltage and which blocks the transmission of the current.

10 Claims, 4 Drawing Sheets

(56) References Cited

U.S. PATENT DOCUMENTS

Figure 4:
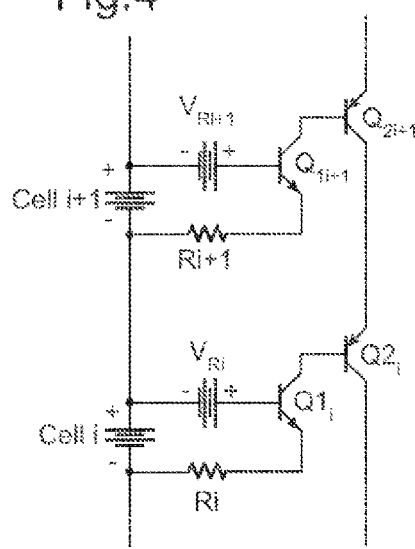

| | | | |
|---|---|---|---|
| 5,818,201 A * | 10/1998 | Stockstad et al. | 320/119 |
| 5,861,812 A | 1/1999 | Mitchell et al. | |
| 7,087,327 B2 * | 8/2006 | Pearson | 429/431 |
| 7,438,984 B2 * | 10/2008 | Aoyagi et al. | 429/430 |
| 8,008,889 B2 * | 8/2011 | Noda | 320/110 |

FOREIGN PATENT DOCUMENTS

| | | |
|---|---|---|
| WO | WO 03/010843 | 2/2003 |
| WO | WO 2006/083080 | 8/2006 |

* cited by examiner

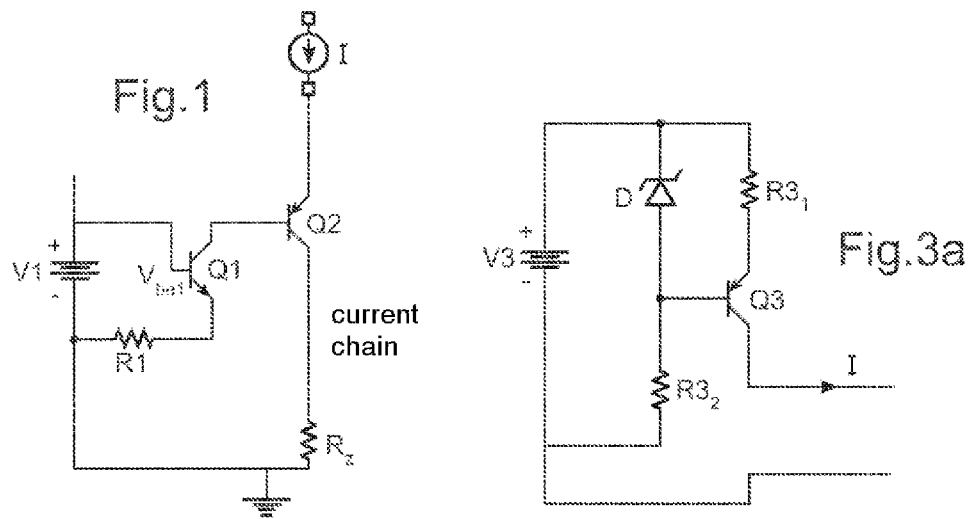
Fig.1
Fig.3a
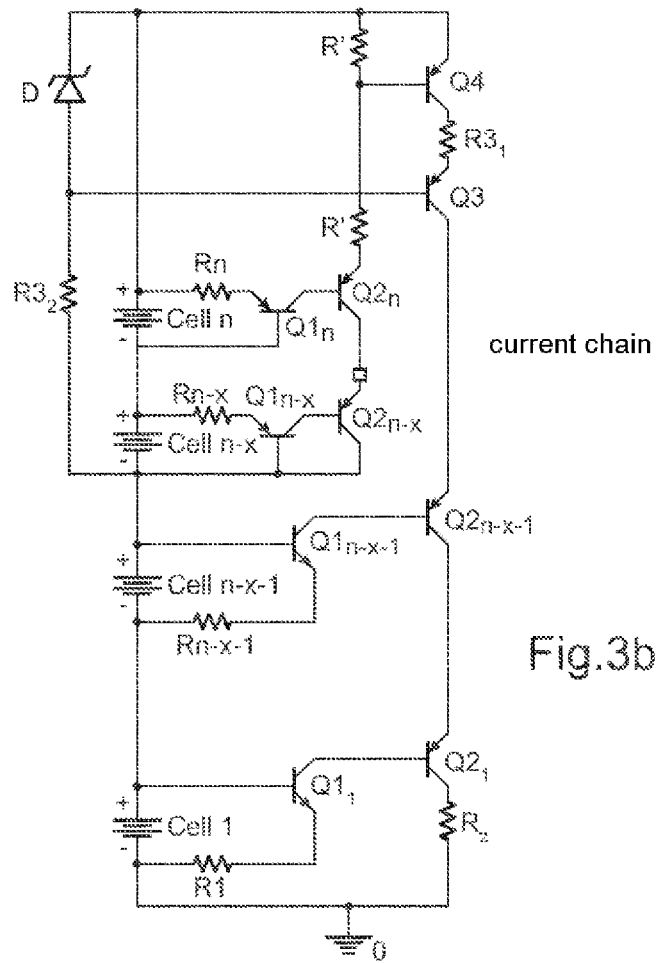
Fig.3b

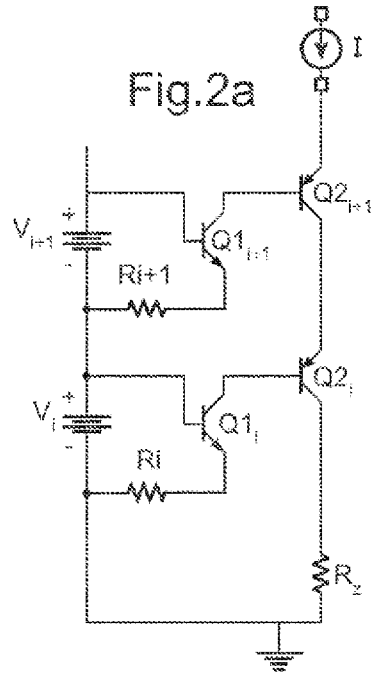
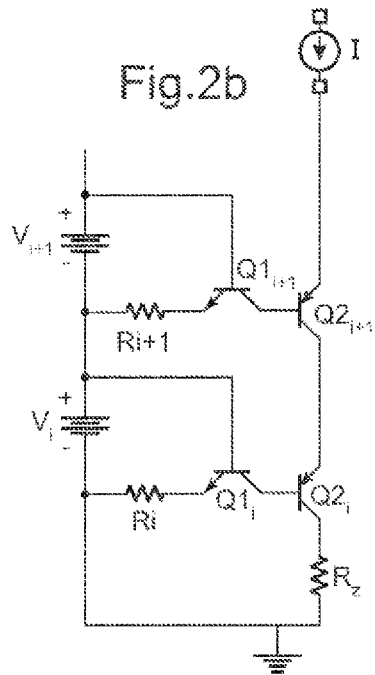
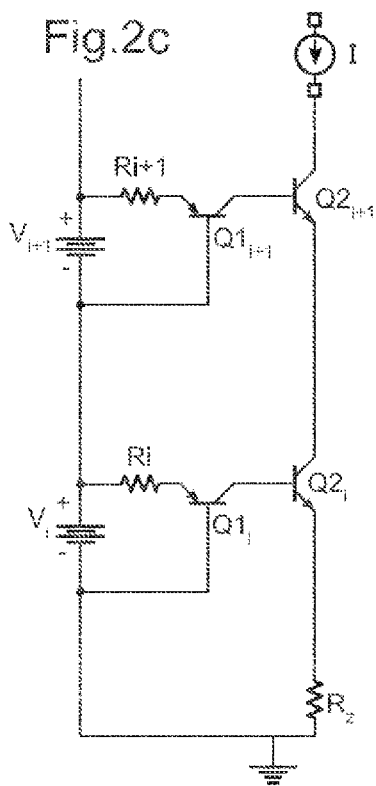
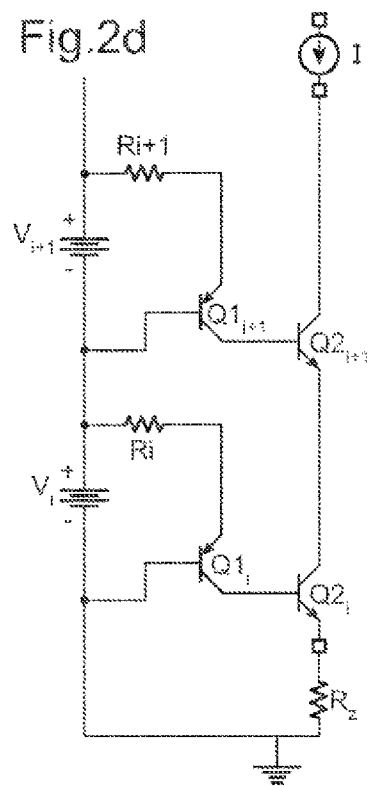

VOLTAGE CONTROL DEVICE FOR A FUEL CELL

CROSS-REFERENCE TO RELATED APPLICATIONS

This application is the National Stage of International Application No. PCT/EP2010/063397, filed on Sep. 13, 2010, which claims the benefit of the priority date of French Application No. 0904381, filed on Sep. 14, 2009. The content of these applications is hereby incorporated by reference in its entirety.

The invention relates to a device for controlling the voltage of one or more individual cells of a fuel cell.

A fuel cell is an electric generator transforming the chemical energy contained in a fuel (hydrogen, methanol, or similar) into an electrical energy. A fuel cell takes the form of an individual cell delivering a voltage of between 0.3 V and 1.2 V depending on the type of fuel, and the current delivered.

In order to obtain good voltage levels, the fuel cell may comprise a number of individual cells mounted in series so as to aggregate the voltage of each of them.

The voltage of an individual cell varies according to the current intensity that it supplies, for example, the voltage drops when the current intensity supplied increases. The voltage delivered by an individual cell may also vary according to the chemical reactions created in the individual cell. The reactions are normally stable, but sometimes a disturbance may occur (for example, a drop of water which is badly discharged, etc.). The voltage then has a tendency to drop rapidly and may then revert to normal when the disturbance has passed.

So as not to degrade an individual cell, it is essential for its voltage never to fall below a certain threshold. If it does, the individual cell may experience overheating and partial deteriorations which result in premature aging thereof or its total deterioration.

According to a known solution of the prior art, the voltage of each individual cell is measured in an analog fashion and this information is transmitted to a controller which checks whether the voltage is above or below a threshold voltage. The controller analyzes, one by one, the voltage of each individual cell by scanning them. Conventionally, galvanic insulation is provided between the fuel cell and the controller so that the controller is not connected to the fuel cell, particularly if it exhibits dangerous voltages.

Moreover, in a series configuration, the current is the same for all the individual cells and is therefore imposed on the individual faulty cell. It may then be concentrated on a portion of the surface of the membrane of the individual cell of the fuel cell and damage the latter, for example by overheating or by partial drying.

The objective of the invention is therefore to make it possible to simply monitor when an individual cell crosses its threshold voltage in order to prevent the deterioration of the individual cell and therefore of the fuel cell.

To this end, the subject of the invention is a device for controlling the voltage of an individual cell of a fuel cell, characterized in that said control device comprises a first transistor associated with the individual cell linked on the one hand to the individual cell by its base and on the other hand to a current generator and, such that, when the individual cell exhibits a voltage greater than a first threshold voltage, the first transistor exhibits, at the terminals of its base-emitter junction, a voltage greater than the second threshold voltage and conducts the current, and, when the individual cell exhibits a voltage less than the first threshold voltage, the first transistor exhibits, at the terminals of its base-emitter junction, a voltage less than the second threshold voltage and blocks the transmission of the current.

Thus, as soon as the individual cell crosses its threshold voltage, the transmission of the current is stopped.

The voltage control device may also comprise one or more of the following characteristics, taken separately or in combination:

said control device is configured to detect the crossing of the first threshold voltage of at least one individual cell of a plurality of series-connected individual cells of the fuel cell, and said control device comprises:
  a plurality of first transistors respectively mounted in parallel with an individual cell associated with the fuel cell by being linked by their bases to the associated individual cell, and
  a plurality of second transistors of second threshold voltage, said second transistors being respectively linked by their bases to the collectors of the first transistors, mounted in series with one another so that a second transistor is linked by its emitter to the collector of a consecutive second transistor, and mounted in series with the current generator, so as to block the transmission of the current when an individual cell exhibits a voltage less than the first threshold voltage, the first threshold voltage is equal to the second threshold voltage, the first threshold voltage is different from the second threshold voltage, and an adjustment voltage source is inserted between each individual cell and each associated first transistor, the adjustment voltage source supplying an adjustment voltage equal to the voltage differential between the first and second threshold voltages, said adjustment voltage source consists of an adjustment current source and a resistor, the adjustment current source comprises a fixed voltage source and a resistor, the fixed voltage source is implemented by a predetermined number of individual cells of the fuel cell, a Zener diode and a resistor, the voltage at the terminals of said individual cells is greater than the Zener voltage of the Zener diode, the current generator is a transistor-based current generator comprising:
  a transistor,
  a first resistor mounted in series with the transistor and linked to the emitter of the transistor,
  a second resistor linked to the base of the transistor to limit the current flowing through the transistor,
  a voltage source,
  a Zener diode in series with the second resistor, mounted in parallel with the voltage source, the Zener diode exhibiting, at its terminals, a constant voltage, and being linked to the first resistor and to the base of the transistor, the voltage source of the current generator consists of a predetermined number of individual cells of the fuel cell, such that the voltage at the terminals of said individual cells is greater than the Zener voltage of the Zener diode, said control device comprises an end-of-current-chain resistor mounted in series with the current generator, to convert the current information into voltage information, and said device comprises an end-of-current-chain optocoupler mounted in series with the current generator, to provide galvanic insulation.

Figure 5:
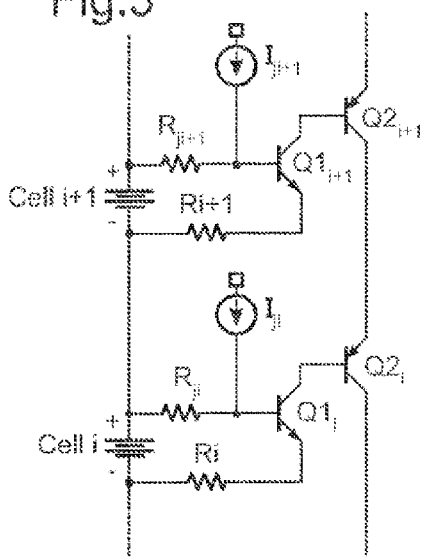
Figure 6:
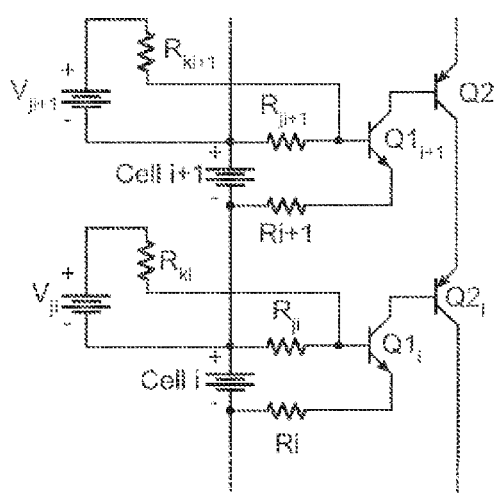
Figure 7:
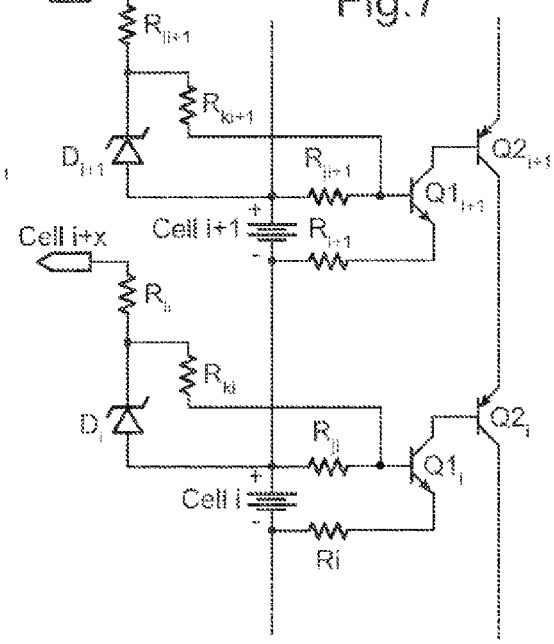
Figure 8:
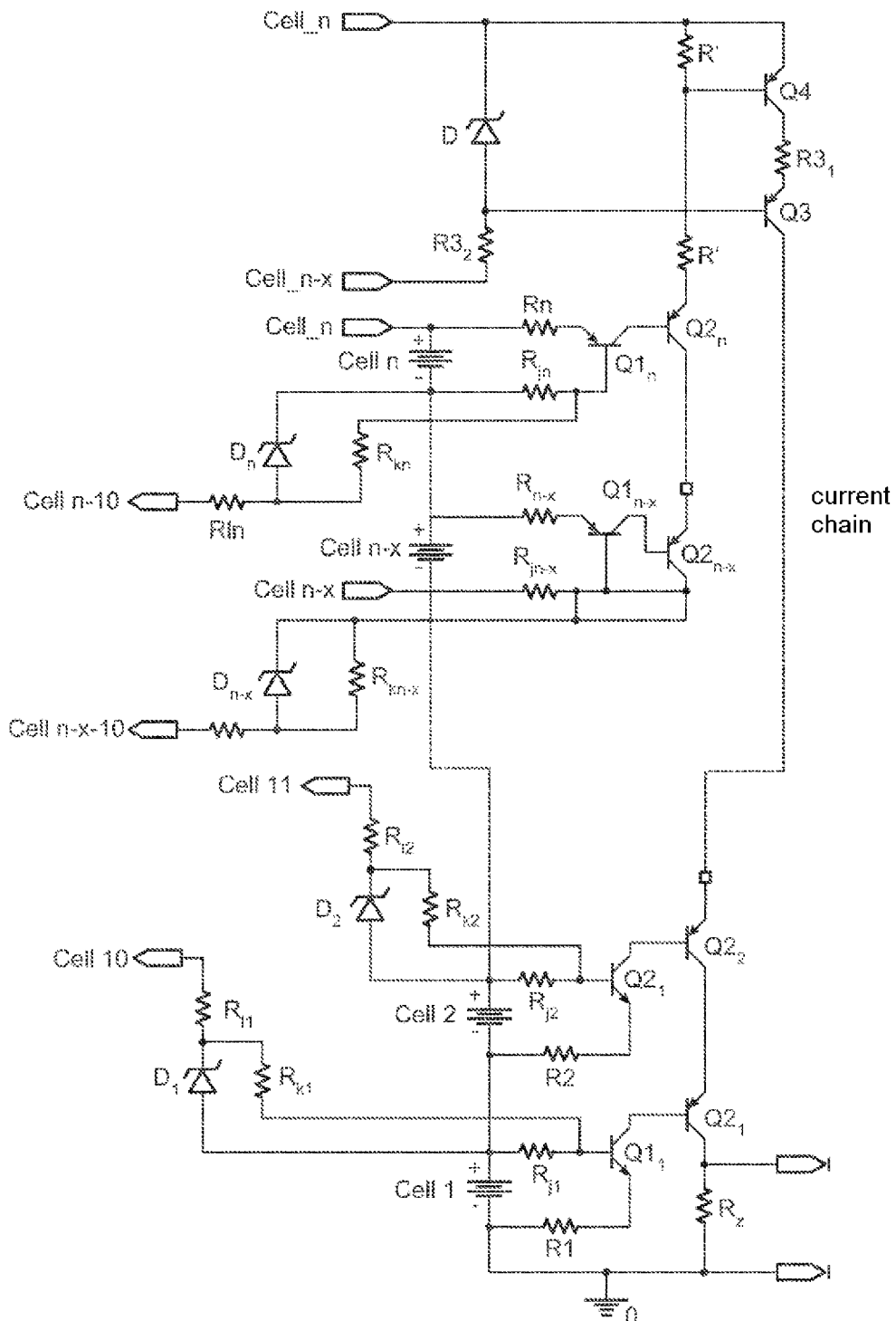

Other features and advantages of the invention will become apparent from the following description, given as a nonlimiting example, in light of the appended drawings in which:

FIG. 1 schematically represents a circuit for controlling the crossing of the threshold voltage of an individual cell of a fuel cell, FIG. 2a is a first exemplary embodiment of a circuit for controlling the crossing of the threshold voltage of series-connected individual cells of a fuel cell, FIG. 2b is a second exemplary embodiment of a circuit for controlling the crossing of the threshold voltage of series-connected individual cells of a fuel cell, FIG. 2c is a third exemplary embodiment of a circuit for controlling the crossing of the threshold voltage of series-connected individual cells of a fuel cell, FIG. 2d is a fourth exemplary embodiment of a circuit for controlling the crossing of the threshold voltage of series-connected individual cells of a fuel cell, FIG. 3a illustrates a transistor-based current generator, FIG. 3b represents a circuit for controlling the crossing of the threshold voltage of series-connected individual cells of a fuel cell comprising the transistor-based current generator of FIG. 3a, FIG. 4 schematically illustrates a second embodiment of the control circuit comprising an adjustment voltage source, FIG. 5 is a diagram representing a first variant embodiment of the adjustment voltage source of FIG. 4, FIG. 6 is a diagram representing a second variant embodiment of the adjustment voltage source of FIG. 4, FIG. 7 is a diagram representing a third exemplary embodiment of the adjustment voltage source of FIG. 4, and FIG. 8 schematically represents a circuit for controlling the crossing of the threshold voltage of series-connected individual cells of a fuel cell, comprising an adjustment voltage source according to the third variant of FIG. 7.

In these figures, identical elements are given the same references.

FIG. 1 illustrates a first exemplary circuit for controlling the voltage V1 of an individual cell of a fuel cell. As an example, the threshold voltage of the individual cell is 0.6 V.

A first transistor Q1 is mounted in parallel with the individual cell. In this example, the first transistor Q1 is an NPN transistor whose base is linked to the positive pole + of the individual cell and the emitter is connected to the negative pole − of the individual cell. Obviously, a PNP transistor may equally be provided.

According to a first embodiment, the threshold voltage of the first transistor Q1 is the same as that of the individual cell, namely 0.6 V in this example.

The voltage at the terminals of the base-emitter junction Vbe1 of the first transistor Q1 is dependent on the voltage V1 of the individual cell.

Thus, when the voltage V1 of the individual cell is greater than the threshold voltage (V1>0.6 V), there is no danger of deterioration of the individual cell, the first transistor Q1 exhibits a voltage at the terminals of its base-emitter junction Vbe1 greater than 0.6 V (Vbe1>0.6 V). The first transistor Q1 is therefore passing.

On the other hand, when the voltage V1 of the individual cell is less than 0.6 V (V1<0.6 V), there is danger for the individual cell. The voltage at the terminals of the base-emitter junction of the first transistor Q1 is then also less than 0.6 V (Vbe1<0.6 V) and is then insufficient for the first transistor Q1 to be passing. The first transistor Q1 is therefore blocked.

As can be seen in FIG. 1, the first transistor is also linked to a current generator I for example via a second transistor Q2 mounted in series with the current generator I on a current chain. More specifically, the second transistor Q2, in this case a PNP transistor, is linked by its base to the collector of the first transistor Q1 and by its emitter to the current generator I.

Thus, when the first transistor Q1 exhibits a voltage Vbe1 greater than 0.6 V and is therefore passing, the first transistor causes the saturation of the second transistor Q2 which becomes passing in turn, which allows for the passage of a current I delivered by the current generator I.

On the other hand, when the first transistor Q1 exhibits a voltage Vbe1 less than 0.6 V and is therefore blocked, the current flowing through it is stopped, which results in the blocking of the second transistor Q2. There is therefore no longer current flowing in the current chain. The transmission of current is stopped.

Furthermore, in order to limit the current in the first transistor Q1 and the second transistor Q2, a resistor R1 can be provided, inserted between the emitter of the first transistor Q1 and the individual cell.

Moreover, at the end of the current chain, the information flowing in the form of current can be converted into voltage-type information using a resistor Rz or may even be used to power an optocoupler to provide galvanic insulation.

FIGS. 2a to 2d schematically illustrate variant embodiments of the voltage control circuit for at least two series-connected individual cells of a fuel cell of respective voltages $V_i, V_{i+1}$.

In this case, for each individual cell, a first transistor $Q1_i, Q1_{i+1}$ is mounted in parallel with the associated individual cell by being linked by its base to the associated individual cell, and a second transistor $Q2_i, Q2_{i+1}$ is linked by its base to the collector of an associated first transistor $Q1_i, Q1_{i+1}$.

All the second transistors $Q2_i, Q2_{i+1}$ are mounted in series with one another so that a second transistor is linked by its emitter to the collector of a consecutive second transistor, and with a common current generator I, so as to block the transmission of the current when an individual cell exhibits a voltage less than the threshold voltage.

Furthermore, as previously, a single resistor Rz can be mounted at the end of the current chain.

The examples illustrated in these FIGS. 2a to 2d differ by the NPN or PNP doping of the first $Q1_i, Q1_{i+1}$ and second $Q2_i, Q2_{i+1}$ transistors.

More specifically, in FIGS. 2a and 2b, the first transistors $Q1_i, Q1_{i+1}$ are NPN transistors and the second transistors are PNP transistors in a way similar to the example of FIG. 1. According to this configuration, a second transistor $Q2_i$ is linked by its emitter to the collector of the next higher consecutive second transistor $Q2_{i+1}$.

In FIGS. 2c and 2d, the first transistors $Q1_i, Q1_{i+1}$ are PNP transistors linked by their bases to the negative pole − of the individual cell and by their emitters to the positive pole + of the individual cell, and the second transistors are NPN transistors such that a second transistor $Q2_i$ is linked by its collector to the emitter of the next higher consecutive second transistor $Q2_{i+1}$.

FIGS. 3a and 3b illustrate a variant embodiment of the control circuit in which the current generator I is a transistor-based current generator whose current can be stopped by a transistor.

Referring to FIG. 3a, the transistor-based current generator comprises:
a transistor Q3,
a first resistor $R3_1$ mounted in series with the transistor Q3 and linked to the emitter of the transistor Q3,
a second resistor $R3_2$ linked to the base of the transistor Q3 to limit the current flowing through the transistor Q3, a voltage source V3, and a Zener diode D in series with the second resistor $R3_2$ mounted in parallel with the voltage source V3, the Zener diode D exhibiting, at its terminals, a constant voltage, and being also linked to the first resistor $R3_1$ and to the base of the transistor Q3.

The Zener diode D sets a potential at the terminals of the junction of the transistor Q3 and of the first resistor $R3_1$. The current flowing through the first resistor $R3_1$ is equal to the ratio of the voltage difference between the Zener diode D and the junction on the first resistor $R3_1$.

The current I is approximately the same as the current flowing through the first resistor $R3_1$. The current I is therefore adjusted according to the first resistor $R3_1$ and the Zener diode D.

As can be seen in FIG. 3b, the voltage V3 can be supplied by a predetermined number of higher individual cells X, from the individual cell Cell n–x to the individual cell Cell n; the first individual cell Cell 1 exhibiting the lowest potential and the nth individual cell Cell n exhibiting the highest potential. The number of individual cells X is defined according to the voltage desired in the design of the current generator. The voltage at the terminals of these X individual cells is greater than the Zener voltage of the Zener diode D.

The number of individual cells between the first individual cell Cell 1 and the nth individual cell Cell n may be large.

In this circuit, there is the transistor-based current generator with the following components: Zener diode D, transistor Q3, resistors $R3_1$ and $R3_2$.

This circuit operates in the same way as that of FIGS. 1 to 2d. When the voltage of an individual cell Cell 1 to Cell n–x–1 is above 0.6 V, the transistor $Q1_1$ to $Q1_{n-x-1}$ conducts, and allows the transistor $Q2_1$ to $Q2_{n-x-1}$ to conduct as well.

The procedure is the same for the X individual cells Cell n–x to Cell n used as voltage source.

Furthermore, a transistor Q4 is linked:

on the one hand by its emitter to the Zener diode D and by its collector to the first resistor $R3_1$ of the transistor-based current generator, and on the other hand to all the series-connected second transistors $Q2_{n-x}$ to $Q2_n$ associated with the X individual cells used as voltage source for the transistor-based current generator.

Thus, if all the series-connected transistors $Q2_{n-x}$ to $Q2_n$ associated with the X individual cells used as voltage source are passing, the transistor Q4 becomes passing in turn and allows for the passage of the current generated by the transistor-based current generator.

Moreover, resistors R' are provided to limit the current flowing through the transistors.

FIG. 4 illustrates a second embodiment in which the threshold voltage of the first transistor differs from the threshold voltage of the associated individual cell to be monitored.

The control device then monitors the crossing of a first threshold voltage of an individual cell using at least one transistor of second threshold voltage different from the first threshold voltage.

In this case, the control device comprises, for each individual cell Cell i, Cell i+1, an adjustment voltage source $V_{Ri}$, $V_{R1+1}$ inserted between the individual cell Cell i, Cell i+1 and the associated first transistor $Q1_i$, $Q1_{i+1}$. The adjustment voltage source supplies a voltage that can be adjusted according to the first threshold voltage of the individual cell and which is added to the voltage of the individual cell.

It is therefore easily possible to adapt the threshold voltage to be monitored.

As an example, for a first individual cell threshold voltage of 0.4 V and a second transistor threshold voltage of 0.6 V, the adjustment voltage source is set between the individual cell and the first transistor to 0.2 V.

Thus, when the voltage of the individual cell is greater than 0.4 V, the voltage of the first transistor at the terminals of its base-emitter junction is greater than the sum of the voltage of the individual cell 0.4 V and the adjustment voltage 0.2 V, in other words 0.6 V.

Similarly, when the voltage of the individual cell is less than 0.4 V, the voltage of the first transistor at the terminals of its base-emitter junction is less than the sum of the voltage of the individual cell 0.4 V and the adjustment voltage 0.2 V, in other words 0.6 V.

FIG. 5 is an exemplary embodiment of the adjustment voltage source in which a resistor $R_{ji}$, $R_{ji+1}$ is used and current $I_{ji}$, $I_{ji+1}$ is injected into it so as to create a voltage at its terminals.

According to an alternative illustrated in FIG. 6, the current source can be created by using a fixed voltage source $V_{ji}$, $V_{ji+1}$ and a resistor bridge $R_{ki}$, $R_{ji}$; $R_{ki+1}$, $R_{ji+1}$.

As a variant, it is possible to use the voltage of a predetermined number of individual cells of the fuel cell and to use a Zener diode $D_i$, $D_{i+1}$ and a resistor $R_{ji}$, $R_{ji+1}$ to obtain a fixed voltage as illustrated in FIG. 7.

The Zener diode $D_i$, respectively $D_{i+1}$, serves as a stable voltage source. The resistors $R_{ki}$ and respectively $R_{ki+1}$ and $R_{ji+1}$, are used as voltage divider. The voltage of the resistor $R_{ji}$, respectively $R_{ji+1}$, is defined by adjusting the value of the components $D_i$, $R_{ki}$ and $R_{ji}$, respectively $D_{i+1}$, $R_{ki+1}$ and $R_{ji+1}$.

For $D_i$, $D_{i+1}$ to be considered as a stable voltage source, it is essential that the voltage at its terminals be much greater than its Zener voltage. It is therefore essential that the voltage at the terminals of the individual cell used as voltage source Cell i+x, Cell i+x+1 be greater than the Zener voltage of the Zener diode $D_i$, $D_{i+1}$.

If the number of series-connected individual cells is fairly large, the individual cell used as voltage source Cell i+x, Cell i+x+1 can be taken, for example, from ten or so individual cells exhibiting the highest potentials.

Furthermore, in the case where the number of series-connected individual cells is sufficiently great to use the potential of a higher individual cell, difficulty arises in regard to the individual cells of high potential. For these individual cells with high potential, the potential needed to create the stable voltage source is then taken from the individual cells exhibiting lower potentials.

In practice, as can be seen in FIG. 8, for the individual cells with low potential like the first two cells Cell 1 and Cell 2, the Zener diode $D_1$, $D_2$ is placed between the positive pole + of the individual cell to be monitored Cell 1, Cell 2, and the potential taken from ten or so individual cells with higher potential, for example from the tenth individual cell Cell 10 for the first individual cell Cell 1, and from the eleventh individual cell Cell 11 for the second individual cell Cell 2.

On the other hand, for the individual cells with high potentials like the individual cells Cell n to Cell n–x, the Zener diode $D_n$ to $D_{n-x}$ is placed between the negative pole – of the individual cell to be monitored Cell n to Cell n–x and the potential taken from ten or so individual cells with lower potential, for example from Cell n–10 for the individual cell Cell n, and from the individual cell Cell n–x–10 for the individual cell Cell n–x.

It will therefore be understood that, with such a control device, it is possible to monitor, simply and effectively, when an individual cell of a fuel cell crosses its threshold voltage by making it possible to stop the transmission of the current, so as to be able to prevent the deterioration of the individual cell and therefore that of the fuel cell.

The invention claimed is:

1. An apparatus comprising a control device for controlling the voltage of an individual cell of a fuel cell, said individual cell having a first threshold voltage, said control device including a first transistor having a base, a base-emitter junction, and a second threshold voltage different from the first threshold voltage, wherein said first transistor is associated with the individual cell, wherein said first transistor is linked to said individual cell by said base, and wherein said first transistor is linked to a current generator for providing current, and an adjustment voltage source inserted between the individual cell and the associated first transistor, wherein said adjustment voltage source supplies an adjustment voltage equal to a voltage differential between the first and second threshold voltages, such that when the individual cell exhibits a voltage greater than the first threshold voltage, the first transistor exhibits, at terminals of the base-emitter junction, a voltage greater than the second threshold voltage and the first transistor conducts the current, and when the individual cell exhibits a voltage less than the first threshold voltage, the first transistor exhibits, at the terminals of the base-emitter junction, a voltage less than the second threshold voltage and the first transistor blocks the transmission of the current.

2. The apparatus of claim 1, wherein said control device is configured to detect crossing of the first threshold voltage of at least one individual cell of a plurality of series-connected individual cells of the fuel cell, and wherein the control device further comprises a plurality of first transistors, each of which has a base, an emitter, and a collector, wherein each of said first transistors is mounted in parallel with a corresponding individual cell associated with the fuel cell, and wherein for each of said first transistor, the base of said first transistor is linked to the individual cell corresponding to the first transistor, and a plurality of second transistors of second threshold voltage, each of which has a base, wherein each of said second transistors is linked by said base thereof to collectors of said first transistors, wherein each of said second transistors is mounted in series with others of said second transistors so that that the emitter of each second transistor is linked to the collector of a consecutive second transistor, and wherein each of said second transistors is mounted in series with said current generator so as to block transmission of said current when an individual cell exhibits a voltage less than the first threshold voltage.

3. The apparatus of claim 1, wherein said adjustment voltage source comprises an adjustment current source and a resistor.

4. The apparatus of claim 3, wherein said adjustment current source comprises a fixed voltage source and a resistor.

5. The apparatus of claim 4, wherein the fixed voltage source is implemented by a predetermined number of individual cells of the fuel cell, a Zener diode and a resistor.

6. The apparatus of claim 5, wherein the voltage at the terminals of the individual cells exceeds the Zener voltage of the Zener diode.

7. The apparatus of claim 1, wherein the current generator comprises a transistor-based current generator having a transistor, a first resistor mounted in series with the transistor and linked to an emitter of the transistor, a second resistor linked to a base of the transistor to limit the current flowing through the transistor, a voltage source, and a Zener diode in series with the second resistor, and mounted in parallel with the voltage source, the Zener diode exhibiting, at terminals thereof, a constant voltage, and being linked to the first resistor and to the base of the transistor.

8. The apparatus of claim 7, wherein the voltage source of the current generator comprises a predetermined number of individual cells of the fuel cell, such that the voltage at the terminals of said individual cells is greater than the Zener voltage of the Zener diode.

9. The apparatus of claim 1, further comprising an end-of-current-chain resistor mounted in series with the current generator, to convert current information into voltage information.

10. The apparatus of claim 1, wherein the control device further comprises an end-of-current-chain opto-coupler mounted in series with the current generator to provide galvanic insulation.

* * * * *